United States Patent [19]

Ueda

[11] Patent Number: 5,073,817

[45] Date of Patent: Dec. 17, 1991

[54] RESIN ENCAPSULATED SEMICONDUCTOR DEVICE WITH HEAT RADIATOR

[75] Inventor: Tetsuya Ueda, Itami, Japan

[73] Assignee: Mitsubishi Denki Kabushiki Kaisha, Japan

[21] Appl. No.: 598,788

[22] Filed: Oct. 17, 1990

Related U.S. Application Data

[63] Continuation of Ser. No. 188,471, Apr. 29, 1988, abandoned.

[30] Foreign Application Priority Data

Apr. 30, 1987 [JP] Japan ................... 62-109327

[51] Int. Cl.⁵ ................... H01L 23/40; H01L 23/12; H01L 23/10
[52] U.S. Cl. ................... 357/81; 357/80
[58] Field of Search ................... 357/81, 72, 74, 70, 357/80, 69

[56] References Cited

U.S. PATENT DOCUMENTS

| | | | |
|---|---|---|---|
| 3,390,114 | 12/1975 | Hodge | 174/52 FP |
| 3,820,153 | 6/1974 | Quinn | 357/81 |
| 3,839,660 | 10/1974 | Stryker | 357/81 |
| 3,946,428 | 3/1976 | Anazawa et al. | 357/81 |
| 4,023,198 | 5/1977 | Malone et al. | 357/81 |
| 4,024,570 | 5/1977 | Hartmann et al. | 357/81 |
| 4,150,393 | 4/1979 | Wilson et al. | 357/80 |
| 4,392,151 | 7/1983 | Iwatani | 357/81 |
| 4,524,238 | 6/1985 | Butt | 357/81 |
| 4,642,716 | 2/1987 | Wakabayashi et al. | 357/81 |
| 4,731,700 | 3/1988 | Woodward et al. | 357/81 |
| 4,891,687 | 11/1990 | Mallik et al. | 357/70 |
| 4,949,188 | 8/1990 | Ueda | 357/69 |
| 4,967,260 | 10/1990 | Butt | 357/80 |

Primary Examiner—Rolf Hille
Assistant Examiner—S. V. Clark
Attorney, Agent, or Firm—Leydig, Voit & Mayer

[57] ABSTRACT

A semiconductor device has a semiconductor chip, leads each having one end thereof connected to respective electrodes disposed on one surface of the semiconductor chip, heat radiation body disposed in contact with the other surface of the semiconductor chip, and a resin molding the semiconductor chip with the other ends of the leads and the heat radiation body exposed.

10 Claims, 10 Drawing Sheets

RESIN ENCAPSULATED SEMICONDUCTOR DEVICE WITH HEAT RADIATOR

This application is a continuation of application No. 07,188,471, filed Apr. 29, 1988 now abandoned.

BACKGROUND OF THE INVENTION

1. Field of the Invention

The present invention relates to a semiconductor device in which a semiconductor chip is bonded onto a film-like tape carrier and a method of manufacturing the same.

2. Description of the Related Art

A conventional semiconductor device of this type has a structure as shown in FIGS. 14A and 14B. A film 1 which is formed of a polyimide-based synthetic resin has, at a central location thereof, a rectangular opening portion 2 that is commonly known as a "center device hole". A plurality of lead patterns 3 are disposed on the film 1. The front end portion of each of the lead patterns 3 projects into the opening portion 2 of the film 1 as an inner lead 3a, while its rear portion projects from the outer periphery of the film 1 as an outer lead 3b. A semiconductor chip 5 is connected to each of the inner leads 3a via a bump 4. The semiconductor chip 5, together with the film 1, is molded by a resin 6.

The conventional semiconductor device having the construction described above has been manufactured in the following manner.

First, a required number of lead patterns 3 are secured to a film 1 which has perforations 7 arranged regularly on both sides thereof, an opening 2 formed at the central location thereof, and outer lead holes 8 formed around the periphery of the opening portion 2, as shown in FIG. 15A. The thus secured lead patterns 3 are supported by support portions 9 located between the opening 2 and the outer lead holes 8, and they each have a test pad 3c at the rear of its outer lead 3b which is positioned beyond the corresponding outer lead hole 8.

Subsequently, a semiconductor chip 5 is inserted into the opening portion 2 of the film 1, and bumps 4 disposed on electrodes of the semiconductor chip 5 are connected to the inner leads 3a (see FIGS. 15B, 16A, and 16B).

At this stage, various tests are conducted, in which the conditions of various connections are tested using the test pads 3c and the operation of the semiconductor chip 5 is tested. Thereafter, the lead patterns 3 are cut between their outer leads 3b and test pads 3c, and the film 1 is cut at bridge portions 10 thereof located between adjacent outer lead holes 8. Finally, the semiconductor chip 5 is molded with a resin 6, thereby producing a semiconductor device such as that shown in FIGS. 14A and 14B.

However, the resin 6 has in general a low thermal conductivity. As a result, in the conventional semiconductor device in which the semiconductor chip 5 is entirely molded with the resin 6, most of the heat generated by the semiconductor chip 5 during the operation of the device inevitably accumulates in the resin 6. This may lead to a risk that the temperature of the semiconductor chip 5 within the resin 6 may rise, thereby deteriorating the characteristics and the operational reliability of the semiconductor device.

SUMMARY OF THE INVENTION

The present invention has been accomplished to eliminate the above-stated problem. An object of the present invention is to provide a semiconductor device in which heat generated by the semiconductor chip during the operation of the device can be efficiently radiated to the outside.

Another object of the present invention is to provide a method of manufacturing a semiconductor device featuring the above-mentioned advantage.

According to one aspect of the present invention, a semiconductor device comprises:

a semiconductor chip having first and second surfaces;

leads each having one end thereof connected to an electrode disposed on the first surface of the semiconductor chip;

heat radiation means disposed in contact with the second surface of the semiconductor chip; and molding means molding the semiconductor chip the other ends of the leads and the heat radiation means exposed to the outside.

According to this aspect of the present invention, the heat radiation means disposed in contact with the semiconductor chip is exposed to the outside. Therefore, heat generated by the semiconductor chip can be radiated efficiently.

According to another aspect of the present invention, a method of manufacturing a semiconductor device comprises the steps of:

introducing a semiconductor chip having first and second surfaces into an opening formed in a first film;

connecting electrodes provided on the first surface of the semiconductor chip to leads bonded onto the first film and projecting into the opening;

aligning the position of a second film having heat radiation means with that of the first film;

bonding the heat radiation means to the second surface of the semiconductor chip and bonding the second film to the first film; and molding the semiconductor chip with the heat radiation means exposed.

DESCRIPTION OF THE PREFERRED EMBODIMENTS

Figure 1:
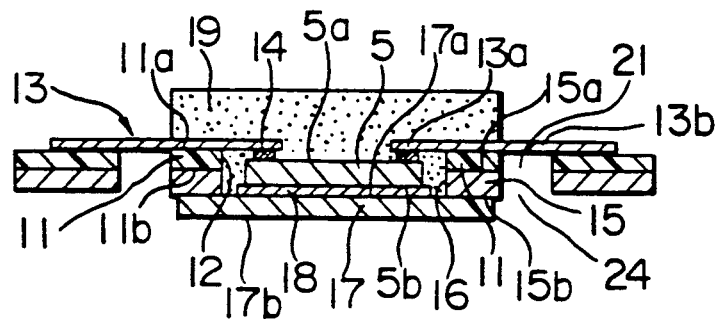
FIG. 1 is a sectional view illustrating a semiconductor device in accordance with one embodiment of the present invention.

As shown in FIG. 1, a semiconductor device according to one embodiment of the present invention has a first film 11 formed of, for instance, a polyimide-based synthetic resin. A rectangular opening 12 is formed at the central portion of the first film 11. The first film 11 has one surface 11a on which a plurality of lead patterns 13 are disposed. The front end portion of each of the lead patterns 13 projects into the opening 12 as an inner lead 13a, while the rear portion of each lead pattern 13 projects from the outer periphery of the first film 11 as an outer lead 13b. A semiconductor chip 5 is placed inside the opening 12, and bumps 14 disposed on one surface 5a of the semiconductor chip 5 are each connected to each of the inner leads 13a.

A second film 15 which is formed of a metal material having a high thermal conductivity is bonded at one surface 15a thereof to the other surface 11b of the first film 11. The second film 15 has an opening 16 which is formed at a location corresponding to that of the opening 12 of the first film 11 and which has the same size as this opening 12. A heat radiation body 17 is provided on the other surface 15b of the second film 15. The heat radiation body 17 has a film-shaped configuration and is formed of a metal material which is the same as that of the second film 15. The peripheral portion of the heat radiating body 17 is bonded to the portion of the second film 15 that is around the periphery of the opening 16, while the central portion of the body 17 is bonded to the other or reverse surface 5b of the semiconductor chip 5 by an adhesive 18 which is, for instance, epoxy resin based. The opening 16 of the second film 15 is covered by the heat radiation body 17.

A molding means 19 which is formed of a synthetic resin, such as an epoxy- or silicone-based resin, is disposed in the remaining parts of the openings 12 and 16 of the first and second films 11 and 15, respectively, as well as over the semiconductor chip 5. Thus, the semiconductor chip 5 is molded with the resin 19 and the heat radiation body 17. In other words, the semiconductor chip 5 is bonded to one surface 17a of the heat radiation body 17, the other surface 17b of the body 17 being exposed to the outside of the device.

In the semiconductor device constructed as described above, since the heat radiation body 17 faces the outside, heat generated by the semiconductor chip 5 during the operation of the semiconductor device can be radiated to the outside efficiently through the high thermal-conductivity heat radiation body 17. Therefore, any rise in temperature of the semiconductor chip 5 is restricted, thereby ensuring stable operation of the device.

Next, a method of manufacturing a semiconductor device such as that described above will be explained.

Figure 2A:
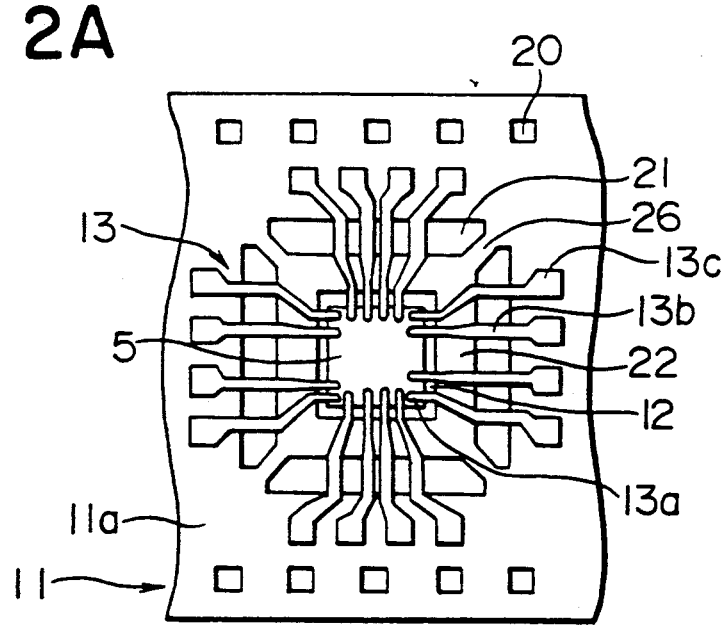
FIGS. 2A, 2B, and 3 are views illustrating processes in a method of manufacturing the semiconductor device shown in FIG. 1.

First, as shown in FIG. 2A, a required number of lead patterns 13 are secured to one surface 11a of a first film 11 which has perforations 20 regularly arranged on both sides thereof, an opening 12 formed at the central portion thereof, and outer lead holes 21 formed around the periphery of the opening portion 12. The thus secured lead patterns 13 are supported by support portions 22 located between the opening 12 and the outer lead holes 21. The lead patterns 13 each have an inner lead 13a, an outer lead 13b which is at the rear end of the inner lead 13a and which is positioned above the corresponding outer lead hole 21, and a test pad 13c further at the rear of the outer lead 13b.

Subsequently, a semiconductor chip 5 is inserted into the opening 12 of the first film 11, and bumps 14 disposed on electrodes of the semiconductor chip 5 are connected to the inner leads 13a. At this stage, various tests are conducted; for instance, the conditions of various connections are tested using the test pads 13c, and the operations of the semiconductor chip 5 are tested.

Figure 2B:
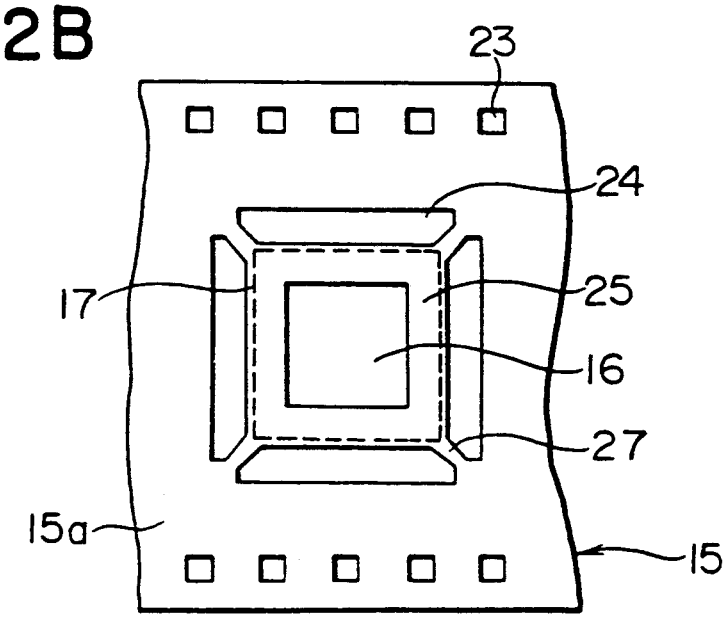

On the other hand, as shown in FIG. 2B, a second film 15 having the same size and configuration as the first film 11 is prepared. More specifically, the second film 15 has perforations 23 regularly arranged on both sides thereof, an opening portion 16 formed at the central portion thereof, and outer lead holes 24 formed around the periphery of the opening 16. Subsequently, a heat radiation body 17 is disposed on one surface 15b of the second film 15 in such a manner as to close the opening 16, and the peripheral portion of the heat radiation body 17 is bonded to support portions 25 located between the opening 16 and the outer lead holes 24.

Figure 3:
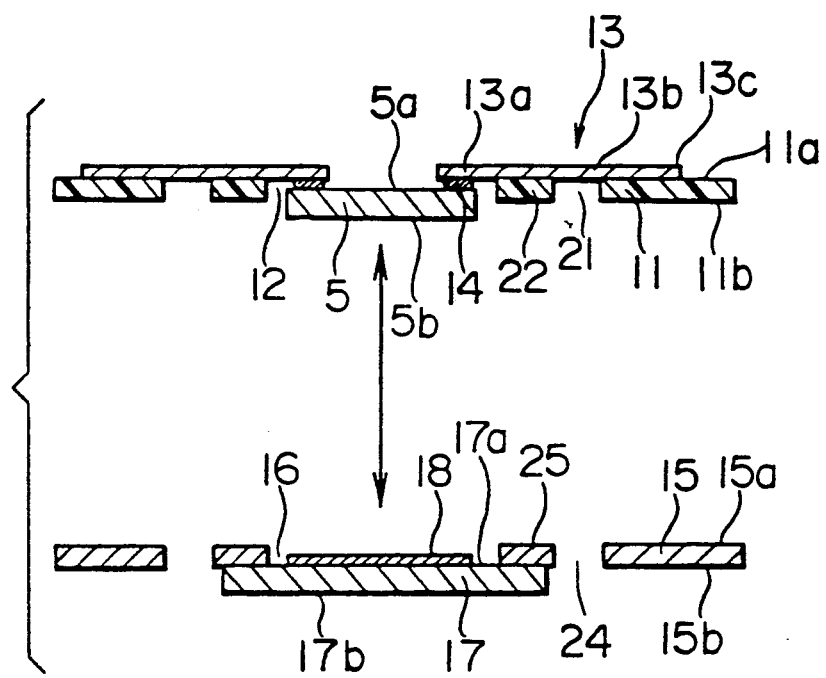

An adhesive 18 is applied to a portion of the heat radiation body 17 within the opening 16 of the second film 15. Subsequently, as shown in FIG. 3, the first film 11 and the second film 15 are positioned in such a manner that their respective openings 12 and 16 are aligned correctly, and the reverse surface 5b of the semiconductor chip 5 is bonded to the adhesion-coated surface of the heat radiation body 17, while the other surfaces 11b and 15a of the first and second films 11 and 15, respectively, are bonded to each other.

Thereafter, the semiconductor chip 5, which is disposed above the heat radiation body 17, is molded with a resin 19. This process is followed by cutting the lead patterns 13 at certain portions thereof between their outer leads 13b and test pads 13c, and by cutting the first and second films 11 and 15 at bridge portions 26 and 27 located between adjacent outer lead holes 21 and 24, respectively. In this way, a semiconductor device such as that shown in FIG. 1 is obtained.

Although the second film 15 is formed of a metal material in the above embodiment, the present invention is not limited thereto, and the second film 15 may alternatively be formed of a synthetic resin material, similarly to the first film 11.

Figure 4:
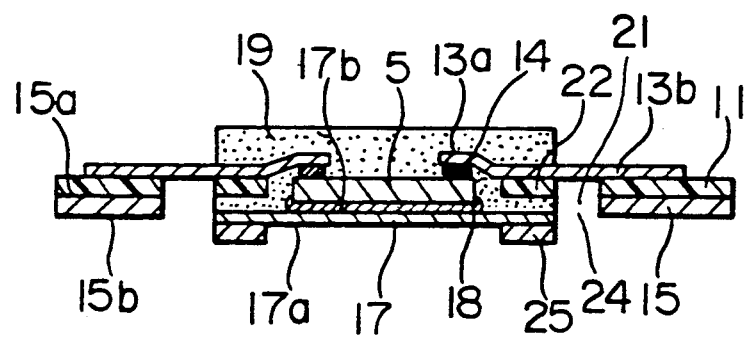
FIGS. 4, 5A, 5B, 6, 7, 8A, 8B, and 9-13 are views illustrating other embodiments of the present invention.

In the above embodiment, the heat radiation body 17 is disposed on the one surface 15b of the second film 15. Alternatively, as shown in FIG. 4, the radiation body 17 may be disposed on the other surface 15a of the second film 15 that is bonded to the first film 11, with the surface 17a of the heat radiation body 17 that is bonded to the second film 15 being exposed (through the opening 16).

Figure 5A:
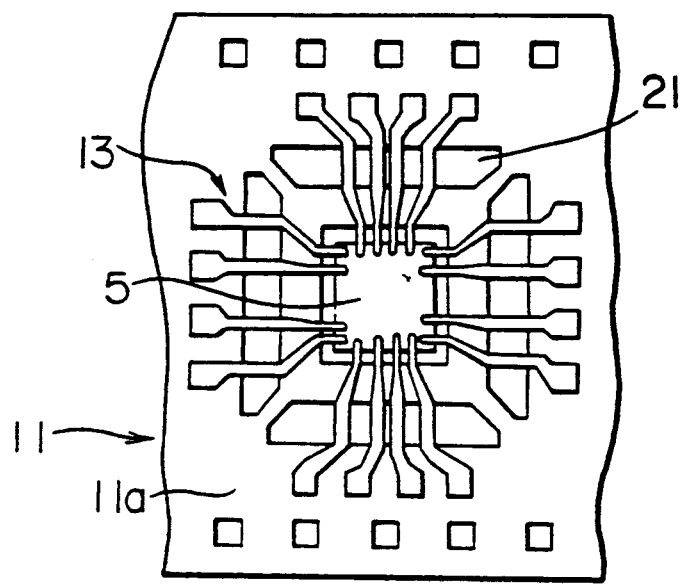
Figure 5B:
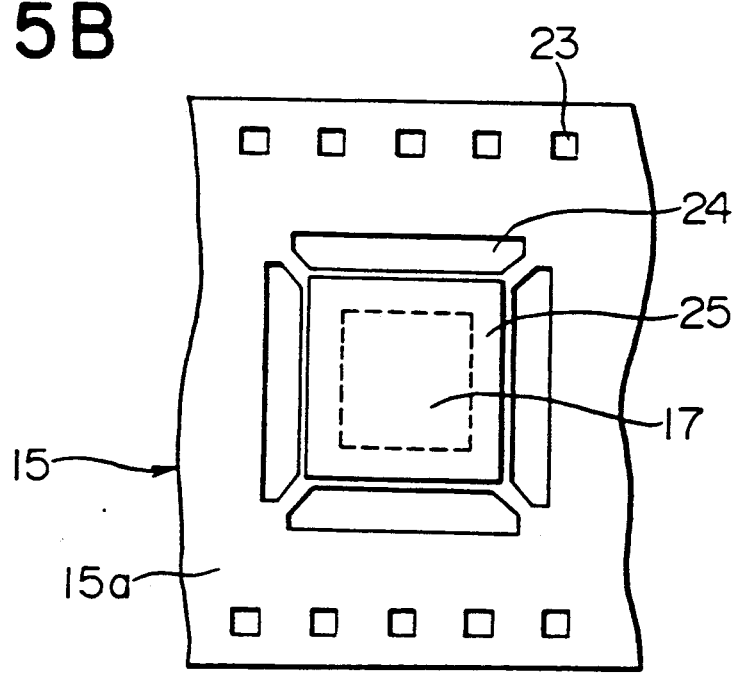
Figure 6:
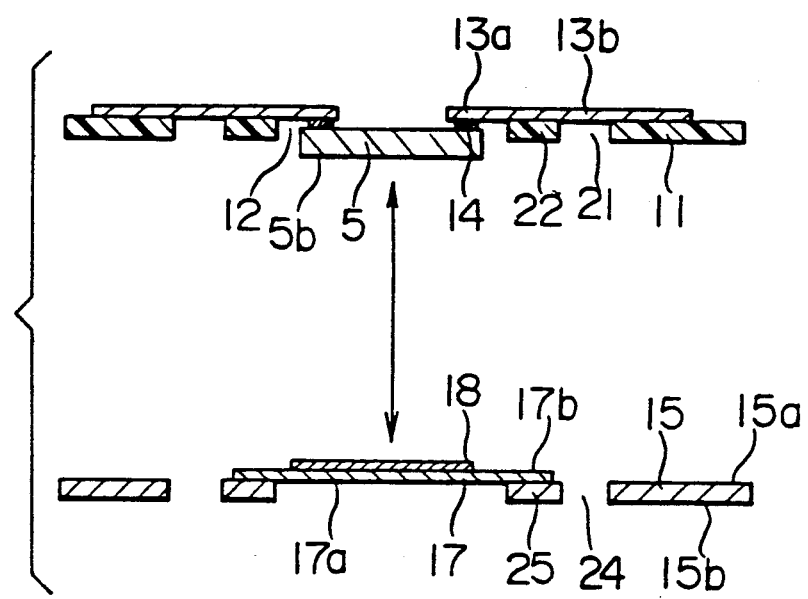

In the manufacture of a semiconductor device having such a construction, as shown in FIG. 5A, a semiconductor chip 5 is mounted on a first film 11 in the same manner as that shown in FIG. 2A. A heat radiation body 17 is, however, bonded to a surface 15a of a second film 15, which is to serve as a surface bonded to the first film 11, as shown in FIG. 5B. The reverse surface 5b of the semiconductor chip 5 is bonded onto the surface 17b of the heat radiation body 17 by an adhesive 18 (see FIG. 6).

Then, the surface 15a of the second film 15 is bonded to the surface 11b of the first film 11 along the portion outside of the radiation body 17. To do so, the bridge portions 27 of the film 15 are somewhat bent downwards to allow the surface 11b of the first film 11 and the surface 15a of the second film 15, respectively to contact each other.

Figure 7:
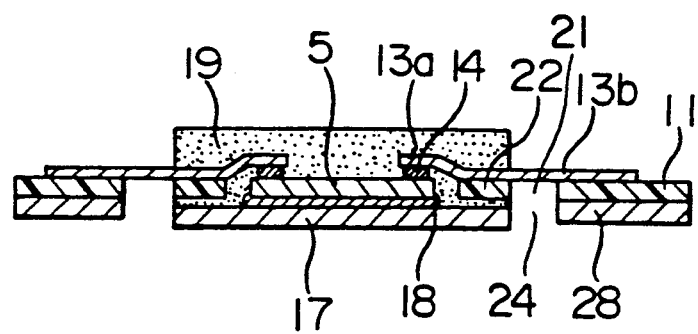
Figure 8A:
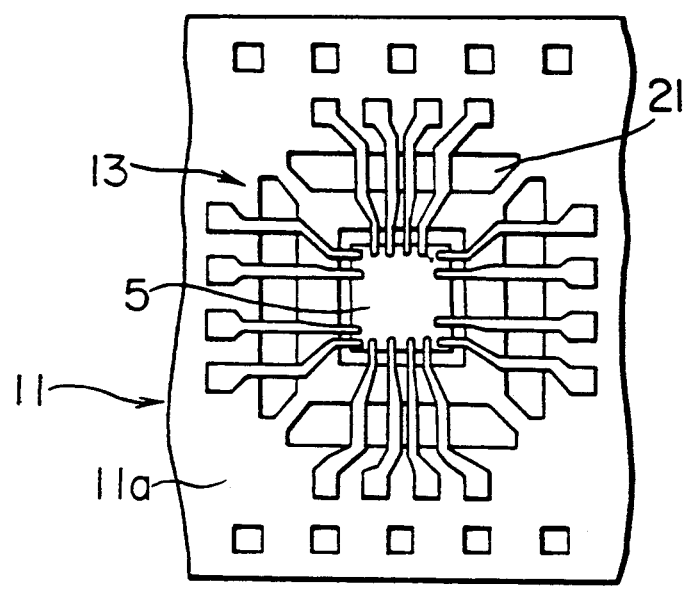
Figure 8B:
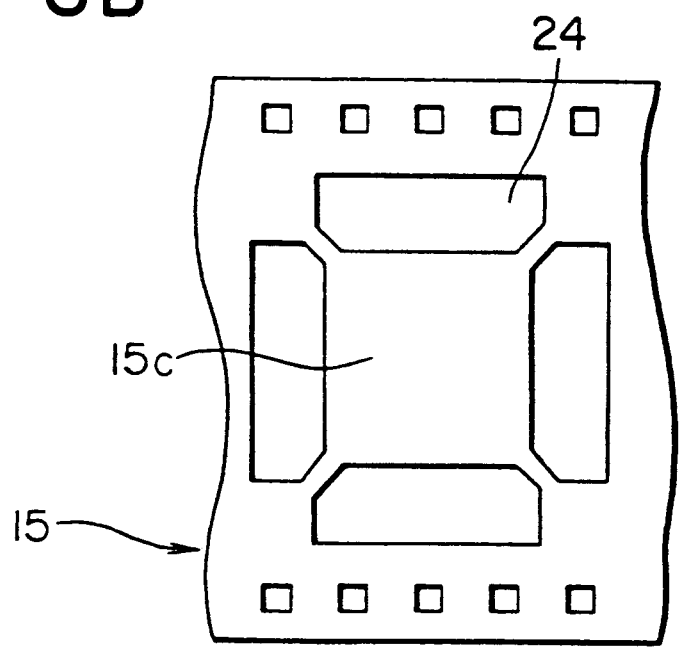
Figure 9:
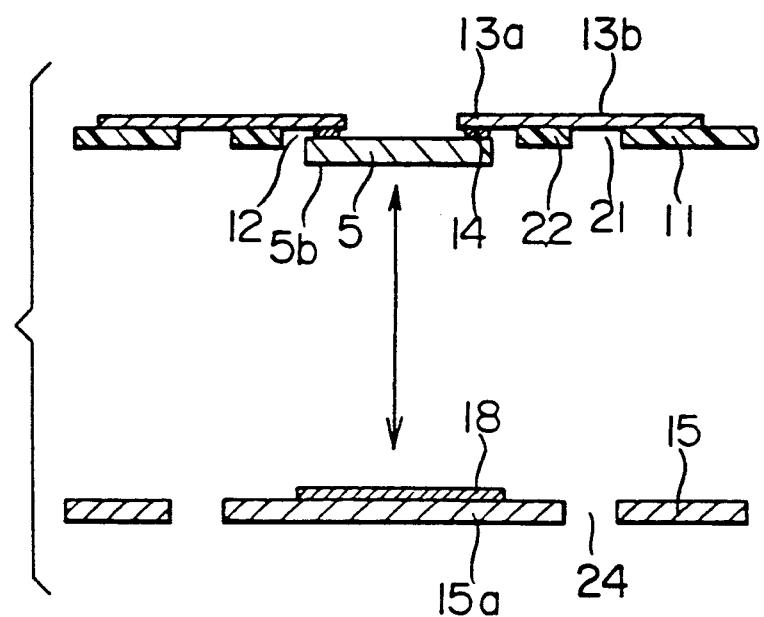

If the second film 15 is formed of a material having an excellent heat conductivity, such as a metal, the second film 15 per se can be used as the heat radiation means, as shown in FIG. 7, instead of using a heat radiation body 17 bonded to the second film. In the manufacture of a semiconductor device having such a construction, as shown in FIG. 7, the reverse surface 5b of a semiconductor chip 5 is bonded directly onto such a second film 15 as described above. More specifically, as shown in FIG. 8A, a semiconductor chip 5 is mounted on a first film 11 in the same manner as that shown in FIG. 2A. However, as shown in FIG. 8B, a second film 15 has no opening portion at the central portion 15c thereof, and this central portion 15c is used as the heat radiation means. That is, an adhesive 18 is coated on the central portion 15c of the second film 15, and the reverse surface 5b of the semiconductor chip 5 is bonded onto this adhesive-coated surface, while certain portions of the first and second films 11 and 15 are bonded together (See FIG. 9).

Figure 10:
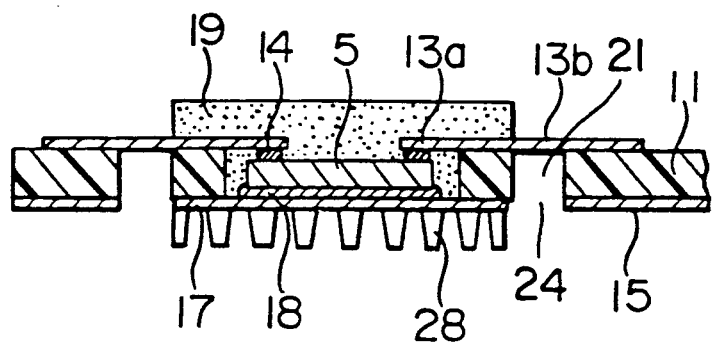
Figure 11:
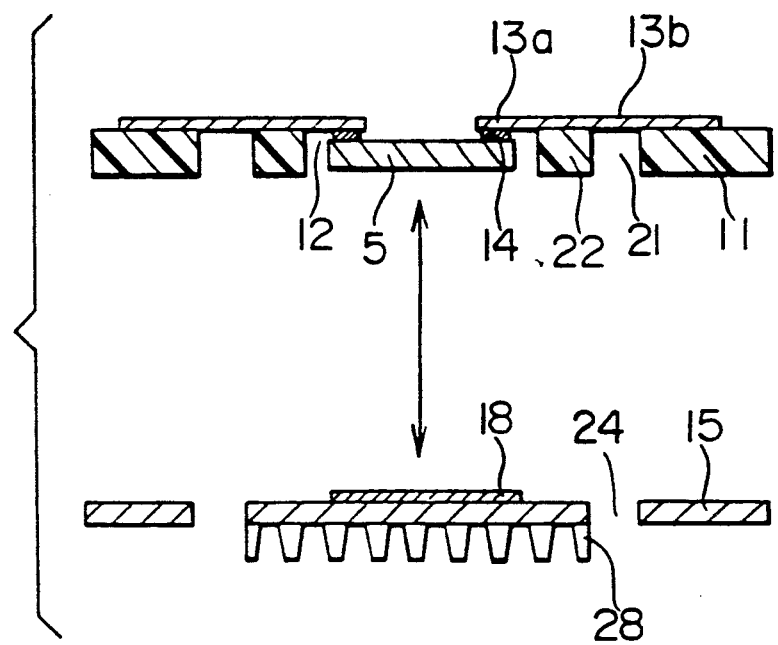

Further, as shown in FIG. 10, a multiplicity of fins 28 may be provided on the exposed surface of a heat radiation body 17, so that the heat radiation effect can be further enhanced. In the manufacture, a second film 15 provided with heat radiation fins 28 is bonded to a first film 11 on which a semiconductor chip 5 is mounted, as shown in FIG. 11.

Figure 12:
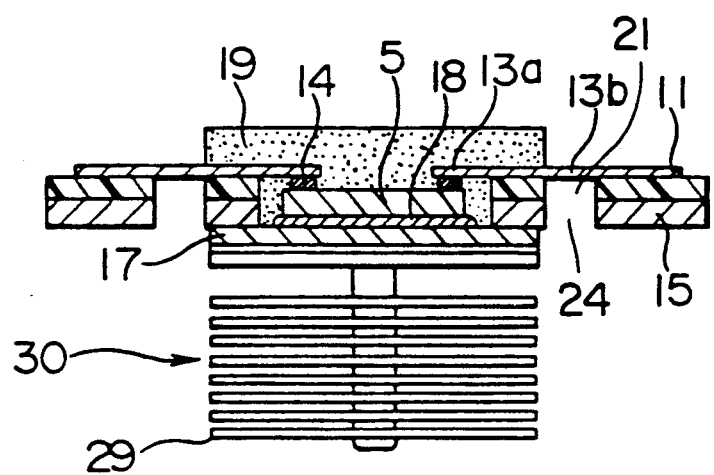
Figure 13:
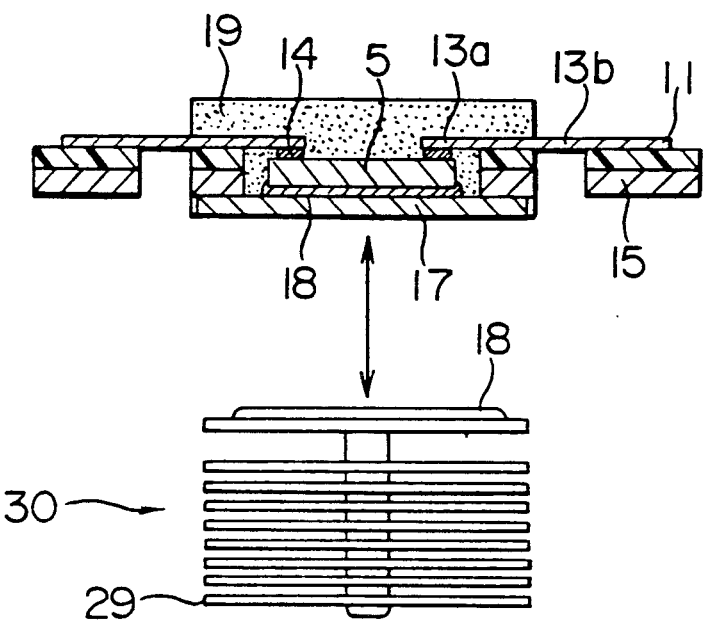
Figure 14A:
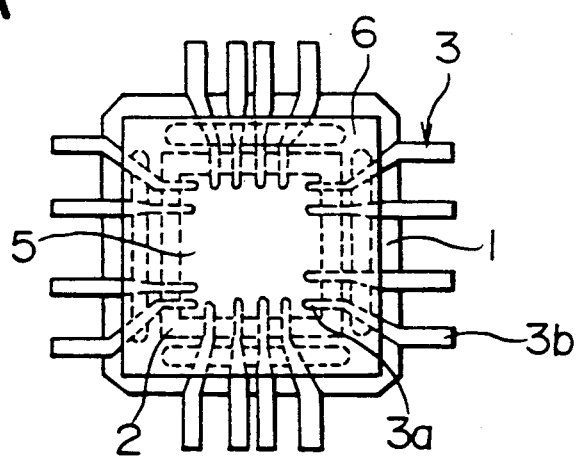
FIGS. 14A and 14B are views illustrating a conventional semiconductor device.
Figure 14B:
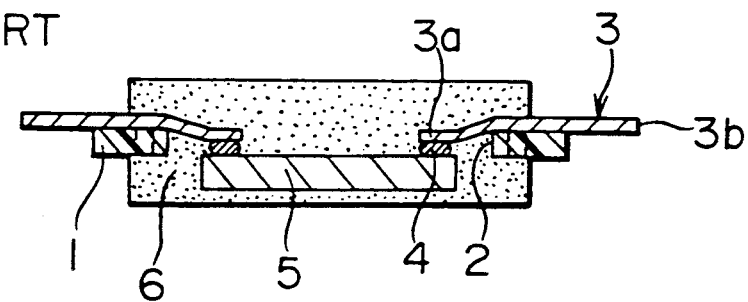
Figure 15A:
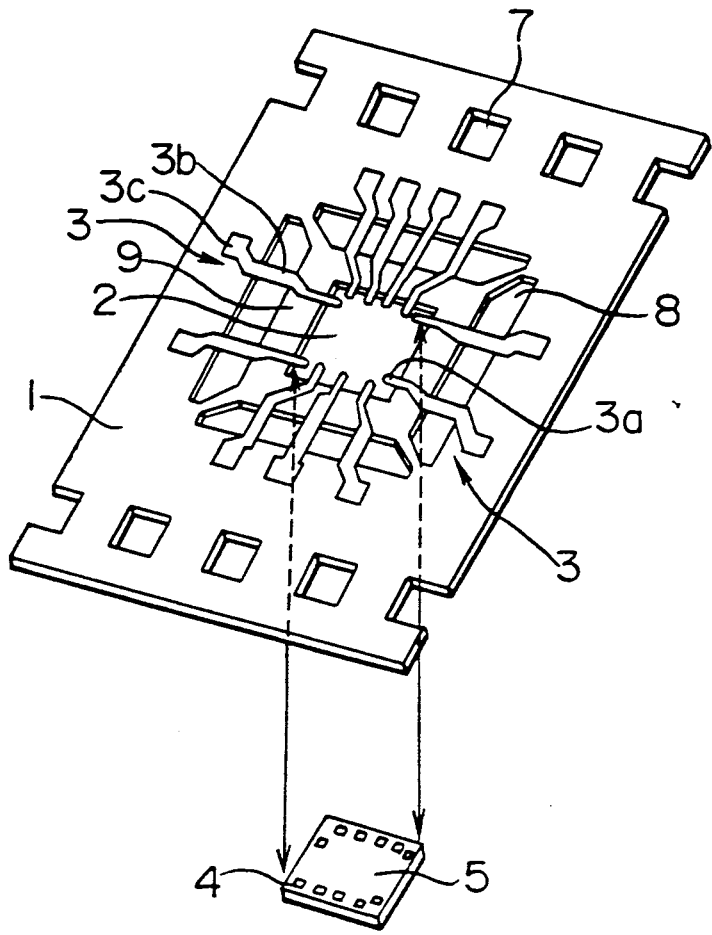
FIGS. 15A, 15B, 16A, and 16B are views illustrating processes for manufacturing a conventional semiconductor device.
Figure 15B:
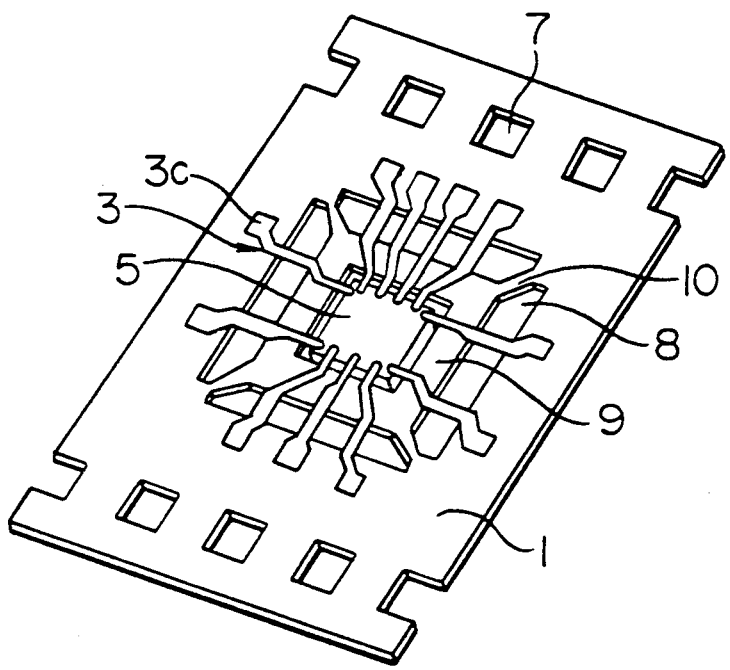
Figure 16A:
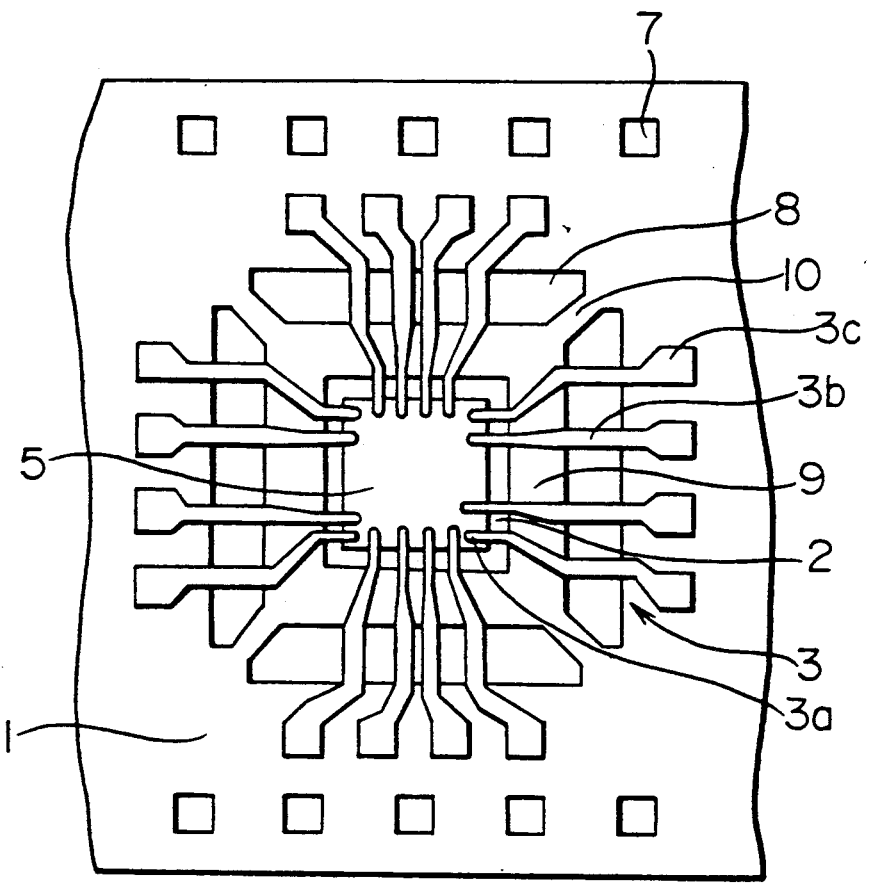
Figure 16B:
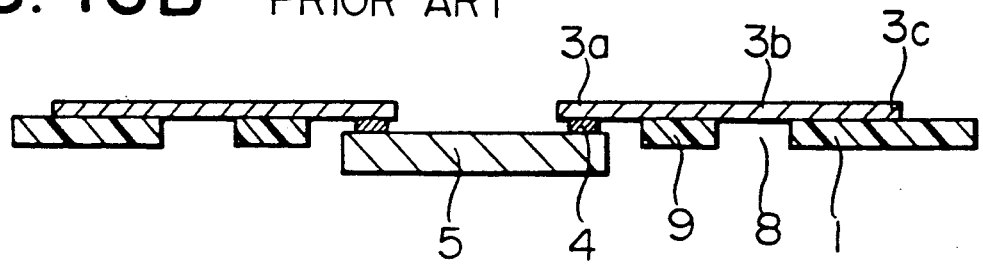

There are various types of heat radiation fins which can be used. For instance, as shown in FIG. 12, a group 30 of heat radiation fins which comprises a plurality of disk-shaped fins 29 which form multiple layers may be used. In this case, the manufacture may be performed in such a manner that, after first and second film 11 and 15 have been bonded and the packaging has been completed, a heat radiation fin group 30 is bonded to the exposed surface of a heat radiation body 17 by an adhesive 18.

The heat radiation fins can be provided in either the structure shown in FIG. 10 in which the second film 15 also serves as the heat radiation means, or the structure shown in FIG. 12 in which the second film 15 and the heat radiation body 17 are separate bodies. It is preferred that the heat radiation fins 28 and 29 be formed of a material having an excellent heat conductivity, such as a metal.

The adhesive 18 used to bond the semiconductor chip 5 and the heat radiation body 17 or to bond the heat radiation body 17 and the heat radiation fins 28 or 29 need not necessarily be epoxyresin based, and the adhesive 18 may alternatively be another suitable material; for instance, solder may be used in the bonding.

What is claimed is:

1. A semiconductor device comprising:
   a semiconductor chip having opposed first and second surfaces and electrodes disposed on said first surface;
   heat radiation means disposed in contact with said second surface of said semiconductor chip;
   a metal film having a central opening and a plurality of outer lead holes spaced from and peripherally disposed with respect to the central opening, said metal film being disposed on said heat radiation means, said semiconductor chip being disposed within the central of said metal film and spaced from said metal film;
   an electrically insulating synthetic resin film having a central opening and a plurality of outer lead holes spaced from and peripherally disposed with respect to the central opening of said electrically insulating synthetic resin film, said electrically insulating synthetic resin film being disposed on said metal film said semiconductor chip being disposed within the central opening of said electrically insulating synthetic resin film and spaced from said electrically insulating synthetic resin film, the central openings and the outer lead holes of said metal and electrically insulating synthetic resin films being respectively disposed in registration with each other;
   a plurality of leads, each lead having first and second ends, the first ends projecting into the central opening of said electrically insulating synthetic resin film and directly contacting respective electrodes on said first surface of said semiconductor chip, the leads being supported intermediate of said first and second ends by the portion of said electrically insulating synthetic resin film lying between the central opening and outer lead holes of said electrically insulating film, electrically insulated from said metal film; and
   a resin encapsulating said semiconductor chip and at least part of said metal and electrically insulating synthetic resin films with the second ends of said leads and said heat radiation means exposed outside said resin.

2. A semiconductor device according to claim 1 wherein said heat radiation means is a plate of a heat conductive material.

3. A semiconductor device according to claim 2 wherein said heat conductive material is a metal.

4. A semiconductor device according to claim 1 wherein said heat radiation means includes heat radiation fins.

5. A semiconductor device comprising:
   a semiconductor chip having opposed first and second surfaces and electrodes disposed on said first surface;
   heat radiation means disposed in contact with said second surface of said semiconductor chip;
   a metal film having a central opening and a plurality of outer lead holes spaced from and peripherally disposed with respect to the central opening, said metal film being disposed on said heat radiation means, said semiconductor chip being disposed in the central opening of said metal film and spaced from said metal film;
   an electrically insulating synthetic resin film having a central opening and a plurality of outer lead holes spaced from and peripherally disposed with respect to the central opening of said electrically insulating synthetic resin film, said electrically insulating synthetic resin film being disposed on said metal film, said semiconductor chip being disposed within the central opening of said electrically insulating synthetic resin film an spaced from said electrically insulating synthetic resin film, the central openings and the outer lead holes of said metal and electrically insulating synthetic resin films being respectively disposed in registration with each other;
   a plurality of leads, each lead having first and second ends, the first ends projecting into the central opening of said electrically insulating synthetic resin film and directly contacting respective electrodes on said first surface of said semiconductor chip, the leads being supported intermediate of said first and second ends by the portion of said electrically insulating synthetic resin film lying between the central opening and outer lead holes of said electrically insulating film, electrically insulated from said metal film; and
   a resin encapsulating said semiconductor chip and at least part of said electrically insulating synthetic resin film with the second ends of said leads, said metal film, and said heat radiation means exposed outside said resin,.

6. A semiconductor device according to claim 5 wherein said heat radiation means is a plate of a heat conductive material.

7. A semiconductor device according to claim 6 wherein said heat conductive material is a metal.

8. A semiconductor device according to claim 5 wherein said heat radiation means includes heat radiation fins.

9. A semiconductor device comprising:
- a semiconductor chip having opposed first and second surfaces and electrodes disposed on said first surface;
- heat radiation means disposed in contact with said second surface of said semiconductor chip including a metal film having a plurality of outer lead holes spaced from and peripherally disposed with respect to said semiconductor chip;
- an electrically insulating synthetic resin film having a central opening and a plurality of outer lead holes spaced from and peripherally disposed with respect to the central opening of said electrically insulating synthetic resin film, said electrically insulating synthetic resin film being disposed on said metal film, said semiconductor chip being disposed within the central opening of said electrically insulating synthetic resin film and spaced from said electrically insulating synthetic resin film, the outer lead holes of said metal and electrically insulating synthetic resin films being disposed in registration with each other;
- a plurality of leads, each lead having first and second ends, the first ends projecting into the central opening of said electrically insulating synthetic resin film and directly contacting respective electrodes on said first surface of said semiconductor chip, the leads being supported intermediate of said first and second ends by the portion of said electrically insulating synthetic resin film lying between the central opening and outer lead holes of said electrically insulating film, electrically insulated from said metal film; and
- a resin encapsulating said semiconductor chip and at least part of said electrically insulating synthetic resin film with the second ends of said leads and said heat radiation means exposed outside said resin.

10. A semiconductor device according to claim 9 wherein said heat radiation means includes heat radiation fins.

* * * * *

UNITED STATES PATENT AND TRADEMARK OFFICE
CERTIFICATE OF CORRECTION

PATENT NO. : 5,073,817

DATED : December 17, 1991

INVENTOR(S) : Tetsuya Ueda

It is certified that error appears in the above-identified patent and that said Letters Patent is hereby corrected as shown below:

On the title page:

Item no. [56], References Cited, change "4,949,188" to --4,949,158--.

change "11-1990" to --1-1990--.

Claim 1, column 5, line 54, after "central" insert --opening--.

line 61, after "metal film" insert --,--.

Signed and Sealed this

Twentieth Day of April, 1993

Attest:

MICHAEL K. KIRK

*Attesting Officer*  *Acting Commissioner of Patents and Trademarks*